(12) United States Patent
Do et al.

(10) Patent No.: US 8,324,689 B2
(45) Date of Patent: Dec. 4, 2012

(54) SELF ALIGNED FIELD EFFECT TRANSISTOR STRUCTURE

(75) Inventors: Lee-Mi Do, Dajeon (KR); Kyu-Ha Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 383 days.

(21) Appl. No.: 12/635,661

(22) Filed: Dec. 10, 2009

(65) Prior Publication Data

US 2010/0155847 A1    Jun. 24, 2010

(30) Foreign Application Priority Data

Dec. 23, 2008  (KR) .................. 10-2008-0132235

(51) Int. Cl.
*H01L 29/66* (2006.01)
(52) U.S. Cl. ..................... 257/365; 438/230
(58) Field of Classification Search ............ 257/365
See application file for complete search history.

(56) References Cited

U.S. PATENT DOCUMENTS

| 6,727,546 | B2 * | 4/2004 | Krivokapic et al. | 257/331 |
| 7,105,894 | B2 * | 9/2006 | Yeo et al. | 257/347 |
| 7,402,862 | B2 | 7/2008 | Choi et al. | |
| 7,508,013 | B2 * | 3/2009 | Howard et al. | 257/134 |
| 2003/0122186 | A1 * | 7/2003 | Sekigawa et al. | 257/316 |
| 2006/0157749 | A1 * | 7/2006 | Okuno | 257/288 |
| 2006/0202266 | A1 * | 9/2006 | Radosavljevic et al. | 257/344 |
| 2007/0001219 | A1 * | 1/2007 | Radosavljevic et al. | 257/327 |
| 2007/0161170 | A1 * | 7/2007 | Orlowski et al. | 438/197 |
| 2007/0287327 | A1 | 12/2007 | Pejo | |
| 2008/0246088 | A1 | 10/2008 | Schuele et al. | |
| 2008/0265293 | A1 | 10/2008 | Lee et al. | |
| 2008/0277666 | A1 | 11/2008 | Jeon et al. | |
| 2009/0026970 | A1 | 1/2009 | Ohtani | |

FOREIGN PATENT DOCUMENTS

| KR | 2007-0001426 A | 1/2007 |
| KR | 10-0680291 B1 | 2/2007 |
| KR | 2008-0002539 A | 1/2008 |
| KR | 2008-0047453 A | 5/2008 |

OTHER PUBLICATIONS

J. Z. Wang et al. "Dewetting of conducting polymer inkjet droplets on patterned surfaces" Nature Materials, vol. 3, Mar. 2004, p. 171-176.

* cited by examiner

*Primary Examiner* — Jenny L Wagner
*Assistant Examiner* — Mark Tornow
(74) *Attorney, Agent, or Firm* — Rabin & Berdo, P.C.

(57) ABSTRACT

Provided is a self aligned field effect transistor structure. The self aligned field effect transistor structure includes: an active region pattern on a substrate; a first gate electrode and a second gate electrode facing each other with the active region pattern therebetween; and a source electrode and a drain electrode connected to the active region pattern and disposed to be symmetric with respect to a line connecting the first and second gate electrodes, wherein the first and second gate electrodes and the source and drain electrodes are disposed on the same plane of the substrate.

13 Claims, 12 Drawing Sheets

SELF ALIGNED FIELD EFFECT TRANSISTOR STRUCTURE

CROSS-REFERENCE TO RELATED APPLICATIONS

This U.S. non-provisional patent application claims priority under 35 U.S.C. §119 of Korean Patent Application No. 10-2008-0132235, filed on Dec. 23, 2008, the entire contents of which are hereby incorporated by reference.

BACKGROUND

The present invention disclosed herein relates to a transistor structure, and more particularly, to a self aligned field effect transistor structure having a plurality of gate electrodes.

Generally, a semiconductor device and a display device may include various kinds of transistor structures as a switching device. For example, the semiconductor device may use a Complementary Metal Oxide Semiconductor (CMOS) transistor as a switching device. The display device may use a Thin Film Transistor (TFT) as a switching device. Among diverse TFTs, a TFT where polysilicon is used for an active layer may operate at a high speed because carriers transfer fast. Accordingly, a polysilicon TFT may be used for a CMOS-TFT, an Erasable and Programmable Read Only Memory (EPROM), an Electrically Erasable and Programmable Read Only Memory (EEPROM), and a Random Access Memory (RAM).

SUMMARY

Example embodiments provide a self aligned field effect transistor structure capable of improving an operation speed by minimizing an overlapping capacitor between a gate electrode and a source/drain electrode.

Example embodiments also provide a self aligned field effect transistor structure capable of improving an operation speed.

Embodiments of the present invention provide self aligned field effect transistor structures including: an active region pattern on a substrate; a first gate electrode and a second gate electrode facing each other with the active region pattern therebetween; and a source electrode and a drain electrode connected to the active region pattern and disposed to be symmetric with respect to a line connecting the first and second gate electrodes, wherein the first and second gate electrodes and the source and drain electrodes are disposed on the same plane of the substrate.

In some embodiments, the active region pattern is disposed on the same plane of the substrate.

In other embodiments, the self aligned field effect transistor structures further include: a first gate insulation pattern surrounding the first gate electrode; and a second gate insulation pattern surrounding the second gate electrode.

In still other embodiments, the first and second gate insulation patterns and the source and drain electrodes are disposed to surround the active region pattern.

In even other embodiments, the top heights of the first and second gate insulation patterns are higher than the top heights of the first and second gate electrodes and the top heights of the source and drain electrodes.

In yet other embodiments, the top height of the active region pattern is lower than the top heights of the first and second gate insulation patterns and is higher than the top heights of the source and drain electrodes.

In further embodiments, the first and second gate electrodes are self-aligned by the first and second gate insulation patterns.

In still further embodiments, the source and drain electrodes are self-aligned by the active region pattern and the first and second gate insulation patterns.

In even further embodiments, the first and second gate electrodes and the source and drain electrodes include the same conductive material.

In yet further embodiments, the first and second gate electrodes and the source and drain electrodes include at least one of Al, Cu, Mo, W, Cr, Ag, Au, Pt, Polyaniline (PANI), a conductive polymer such as PEDOT, a Carbon Nano Tube (CNT), Pyrrolidine, graphite, an organic matter, and a semiconductive polymer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIGS. 10A through 12A are views illustrating processes of forming a self aligned field effect transistor structure according to an embodiment of the present invention; and FIGS. 10B through 12B are sectional views taken along the lines I-I' of FIGS. 10A through 12A, respectively.

DETAILED DESCRIPTION OF EMBODIMENTS

Figure 1:
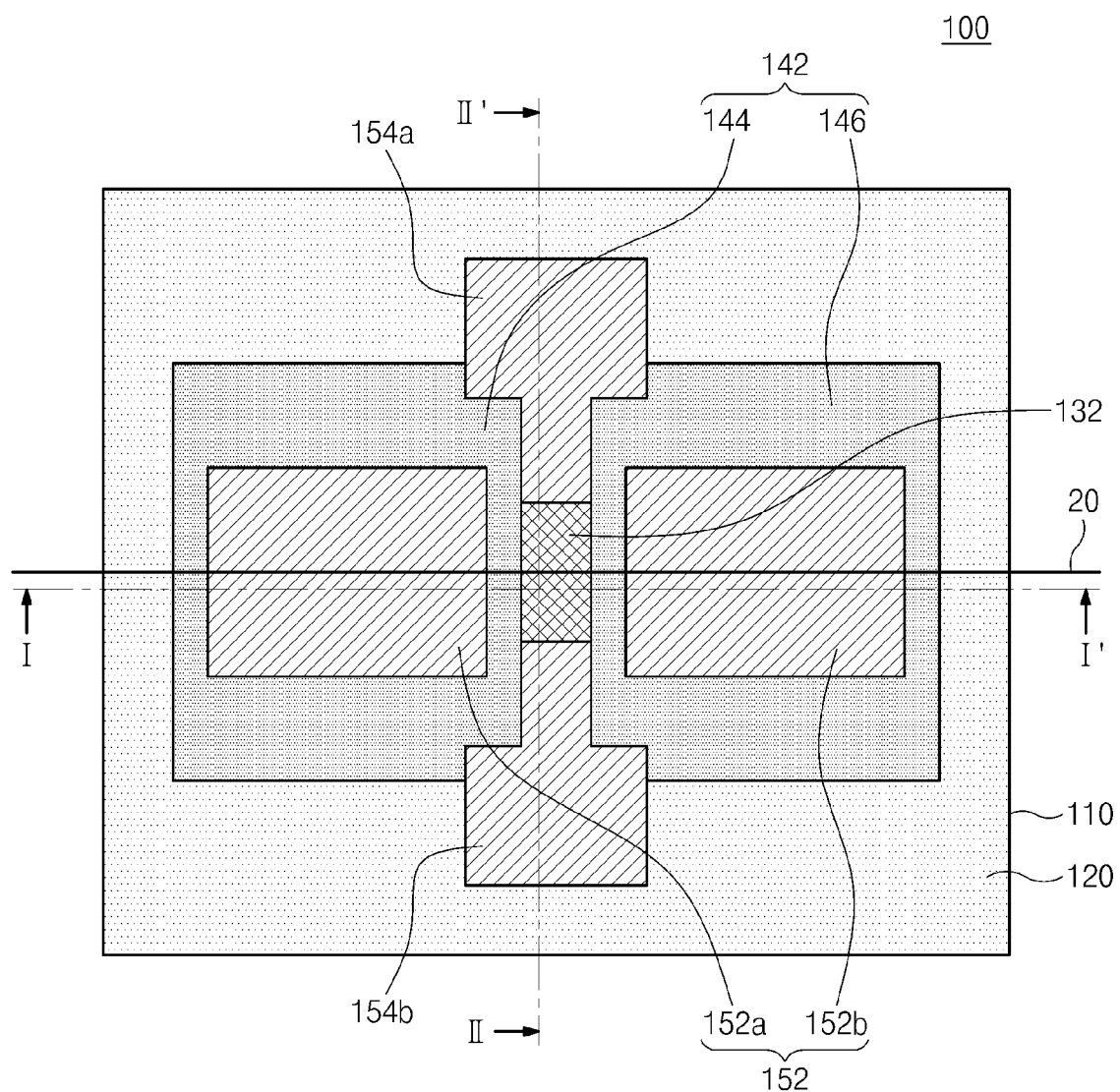
FIG. 1 is a view illustrating a self aligned field effect transistor structure according to an embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 2:
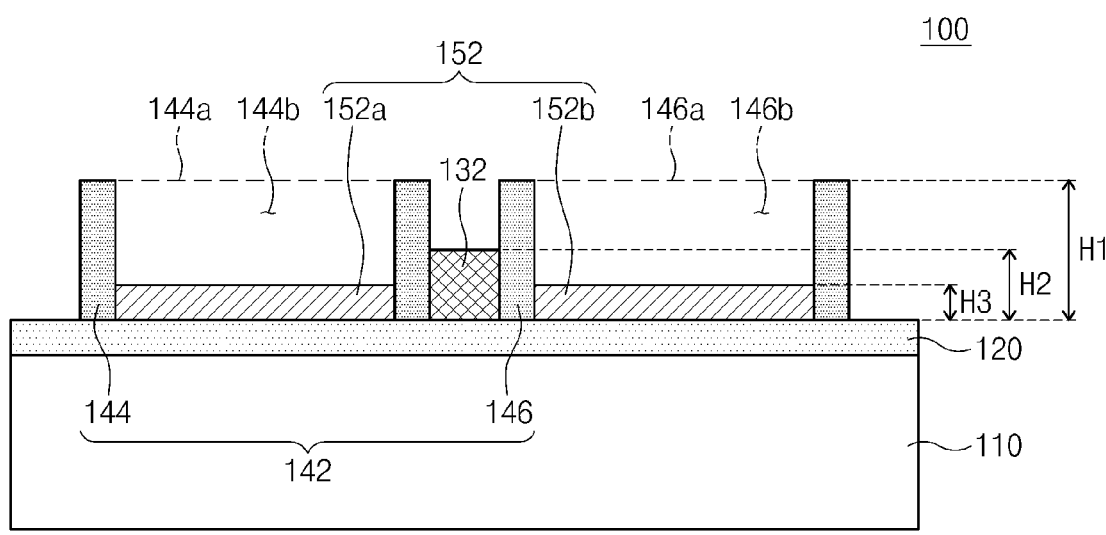
FIG. 2 is a sectional view taken along the line I-I' of FIG. 1.
Figure 3:
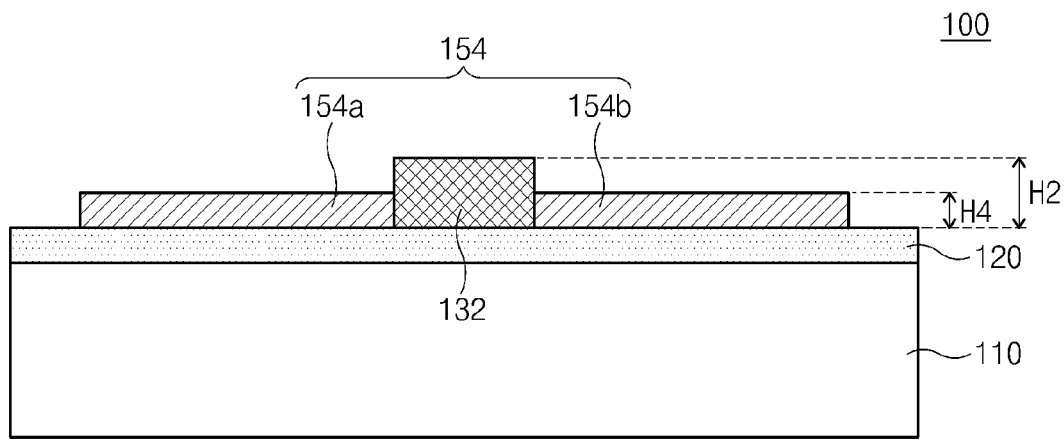
FIG. 3 is a sectional view taken along the line II-II' of FIG. 1.

FIG. 1 is a view illustrating a self aligned field effect transistor structure according to an embodiment of the present invention. FIG. 2 is a sectional view taken along the line I-I' of FIG. 1. FIG. 3 is a sectional view taken along the line II-II' of FIG. 1.

Referring to FIGS. 1 through 3, the self aligned field effect transistor structure 100 includes an active region pattern 132, a gate insulation pattern 142, a gate electrode 152, and a source/drain 154, on a substrate 110.

The substrate 110 may be a base for forming the self aligned field effect transistor structure 100. The substrate 110 may be one of a semiconductor substrate, a transparent substrate, and a plastic substrate. For example, the substrate 110 may include a glass or plastic substrate for manufacturing a display device. A buffer layer 120 may be formed on the substrate 110. The buffer layer 120 may include an insulation layer to protect the substrate 110. The buffer layer 120 may include an oxide layer.

The active region pattern 132 may be disposed being surrounded by the gate insulation pattern 142 and the source/drain 154. The top height H2 of the active region pattern 132 may be lower than the top height H1 of the gate insulation pattern 142. Additionally, the top height H2 of the active region pattern 132 is higher than the top height H4 of the source/drain 154. The active region pattern 132 may include a conductive material where a channel is to be formed. The active region pattern 132 may include at least one of polysilicon, µc-silicon, Polyaniline (PANI), a conducting polymer (for example, PEDOT), Carbon Nano Tube (CNT), Pyrrolidine, and Graphite.

The gate insulation pattern 142 may divide the active region pattern 132 from the gate electrode 152. The gate insulation pattern 142 may include a first gate insulation pattern 144 and a second gate insulation pattern 146. The first and second gate insulation patterns 144 and 146 may be disposed facing each other with the active region pattern 132 therebetween. The first and second gate insulation patterns 144 and 146 may be symmetric to each other based on the active region pattern 132 as a reference line. The first and second gate insulation patterns 144 and 146 may have respective open upper parts 144a and 146b. The top height H1 of the gate insulation pattern 142 is higher than the top height H3 of the gate electrode. Accordingly, the first and second gate insulation patterns 144 and 146 may have first and second inner spaces 144b and 146b, respectively, which are not completely filled by the gate electrode 152. The gate insulation pattern 142 may be formed of an insulation material. For example, the gate insulation pattern 142 may include an oxide layer such as a Spin On Glass (SOG) layer and an aluminum oxide layer. The SOG layer may include a silicon oxide layer. In another example, the gate insulation pattern 142 may include one of a silicon oxide layer, an aluminum nitride layer, an organic matter, and an inorganic matter. The organic matter may be one of Polyvinyl Pyrrolidone (PVP), Polymethylmethacrylate (PMMA), Hydrogen SilsesQuioxane (HSQ), and an acrylic material.

The gate electrode 152 may be disposed in plurality on the substrate 110. In one example, the gate electrode 152 may include a first gate electrode 152a and a second gate electrode 152b. The first and second gate electrodes 152a and 152b may be disposed at both sides of the active region pattern 132. For example, the first and second gate electrodes 152a and 152b may be disposed facing each other based on the active region pattern 132. At this point, the first gate electrode 152a is disposed in the first inner space 144b and the second gate electrode 152b is disposed in the second inner spacer 146b. Accordingly, the first gate electrode 152a is disposed being surrounded by the first gate insulation pattern 144, and the second gate electrode is disposed being surrounded by the second gate insulation pattern 146.

The source/drain 154 may be disposed adjacent to the active region pattern 132 and the gate insulation pattern 142. In one example, the source/drain 154 includes a source electrode 154a and a drain electrode 154b with the active region pattern 132 therebetween, which are disposed being symmetric with respect to a line 20 on the first and second gate electrodes 152a and 152b. The top height H4 of the source/drain 154 may be lower than the top height H1 of the gate insulation pattern 142. Accordingly, the source electrode 154a and the drain electrode 154b may be electrically separated from the gate electrode 152 using the gate insulation pattern 142. Additionally, the top height H4 of the source/drain 154 is lower than the top height H2 of the active region pattern 132.

The gate electrode 152 is self-aligned by the gate insulation pattern 142. For example, as mentioned above, the top height H1 of the gate insulation pattern 142 may be higher than the top height H3 of the gate electrode 152. Accordingly, a conductive material is applied to the substrate 110 having the gate insulation pattern 142 and then flows into the first and second inner spaces 144b and 146b, such that the gate electrode 152 self-aligned by the gate insulation pattern 142 can be formed. Additionally, the source/drain 154 is self-aligned by the active region pattern 132 and the gate insulation pattern 142. For example, as mentioned above, the top height H2 of the active region pattern 132 and the top height H1 of the gate insulation pattern 142 may be higher than the top height H4 of the source/drain 154. Accordingly, the conductive material is applied to the substrate 110 having the active region pattern 132 and the gate insulation pattern 142 and thus, is self-aligned by the active region pattern 132 and the gate insulation pattern 142.

Moreover, since the gate electrode 152 and the source/drain 154 are formed by applying the conductive material to the substrate 110, the first and second gate electrodes 152a and 152b and the source and drain electrodes 154a and 154b are simultaneously formed of the same conductive material. The conductive material may include a metal material or an organic material. As one example, the conductive material may include at least one of Al, Cu, Mo, W, Cr, Ag, Au, and Pt. Additionally, the conductive material may include at least one organic conductor of PANI, a conducting polymer (for example, PEDOT), CNT, Pyrrolidine, and Graphite. In another example, the conductive material may include an organic matter and a semiconductive polymer material.

Additionally, the gate electrode 152 and the source/drain 154 may be disposed on the same plane of the substrate 110. Furthermore, the active region pattern 132 may be disposed on the same plane as the gate electrode 152 and the source/drain 154. Accordingly, the self aligned field effect transistor structure 100 can prevent a parasitic capacitance between the substrate 110 and the gate electrode 152 and between the substrate 110 and the source/drain 154.

Furthermore, a process of forming a self aligned field effect transistor structure according to an embodiment of the present invention will be described in more detail. Here, overlapping description related to the above-mentioned self aligned field effect transistor structure will be omitted or simplified.

Figure 4:
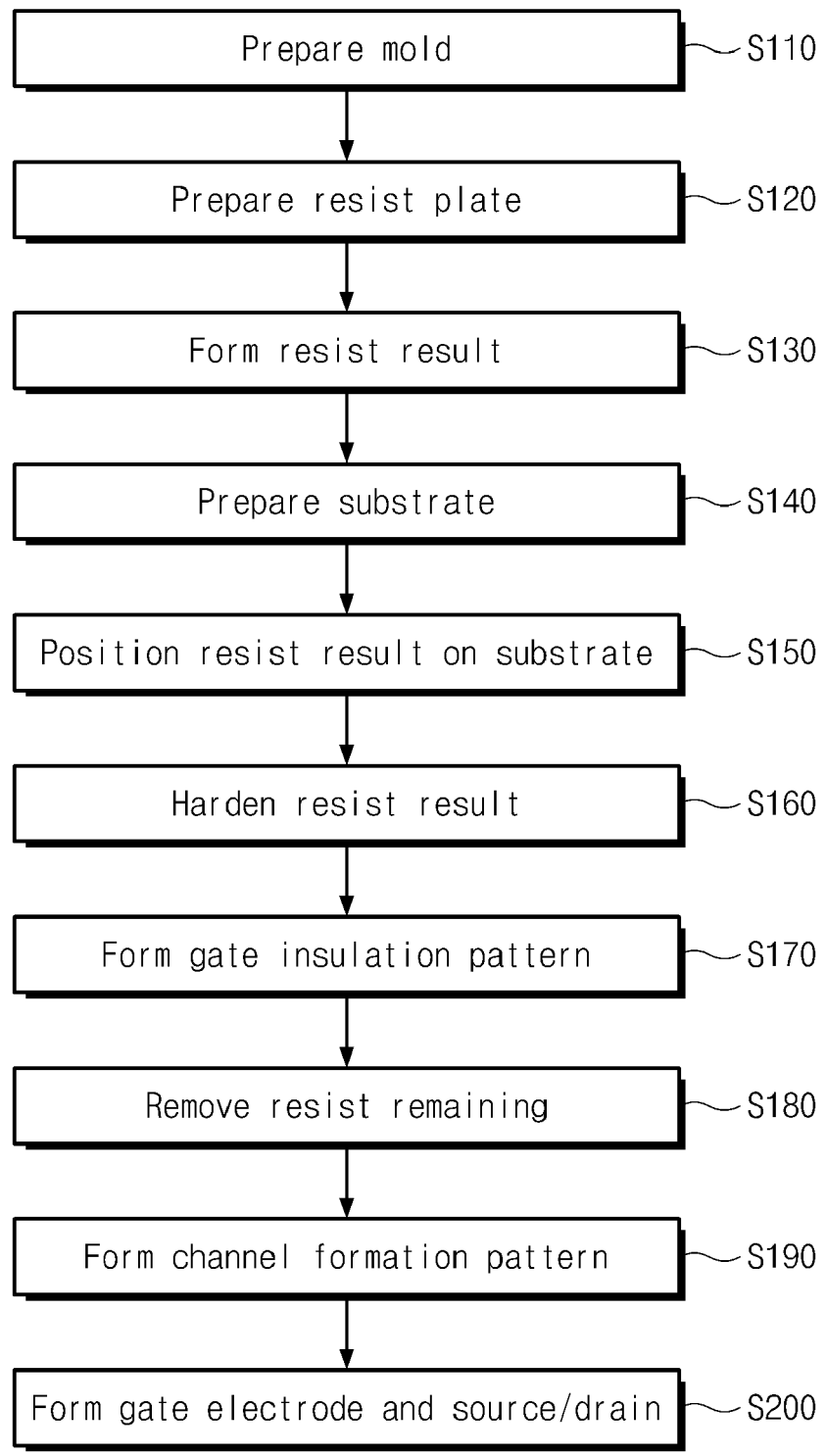
FIG. 4 is a flowchart illustrating a method of forming a self aligned field effect transistor structure according to an embodiment of the present invention.

FIG. 4 is a flowchart illustrating a method of forming a self aligned field effect transistor structure according to an embodiment of the present invention. FIGS. 5 through 9 are views illustrating processes of forming a self aligned field effect transistor structure according to an embodiment of the present invention. FIGS. 10A through 12B are sectional views taken along the lines I-I' of FIGS. 10A through 12A, respectively.

Figure 5:
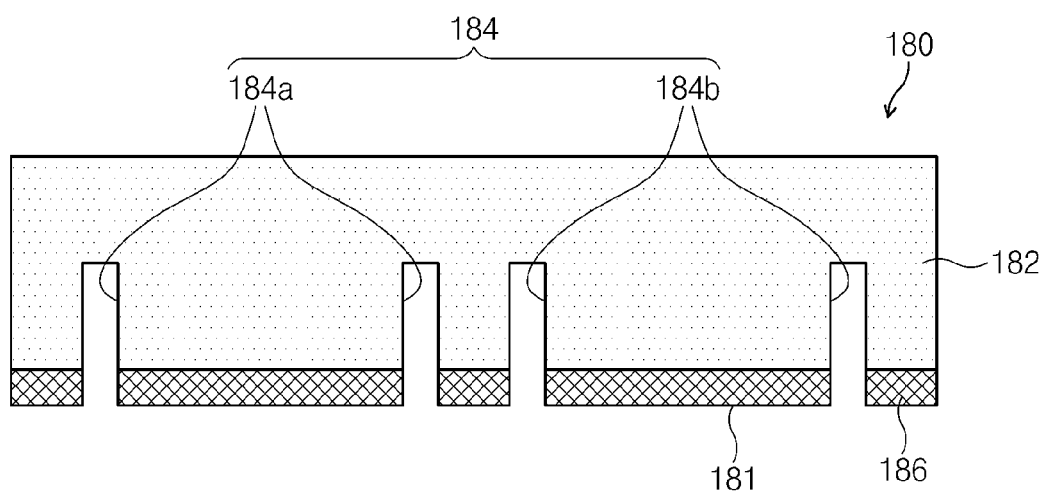
FIGS. 5 through 9 are views illustrating processes of forming a self aligned field effect transistor structure according to an embodiment of the present invention.

Referring to FIGS. 4 and 5, a mold 180 is prepared in operation S110. For example, the preparing of the mold 180 may include preparing a light transmission plate 182 having the front surface 181 where a groove 184 is formed. The light transmission plate 182 may be a transparent plate that can transmit light. For example, the light transmission plate 182 may include an organic matter (for example, Polydimethyl-siloxane (PDMS), Polyisoprene (PMMA), Teflon, or glass. The groove 184 is for forming the gate insulation pattern 142 of FIGS. 1 through 3. Accordingly, the groove 184 may have a form corresponding to the gate insulation pattern 142. For example, the groove 184 includes a first groove 184a having a form corresponding to the first gate insulation pattern 144 of FIGS. 1 through 3 and a second groove 184b having a form corresponding to the second gate insulation pattern 146 of FIGS. 1 through 3.

A light blocking layer 186 is formed on the front surface 181 of the light transmission plate 182. The light blocking layer 186 may be formed of a material that can block the light. For example, the light blocking layer 186 may be formed of at least one of Cr, Al, Ti, Ag, Au, W, Ni, and Cu.

Figure 6:
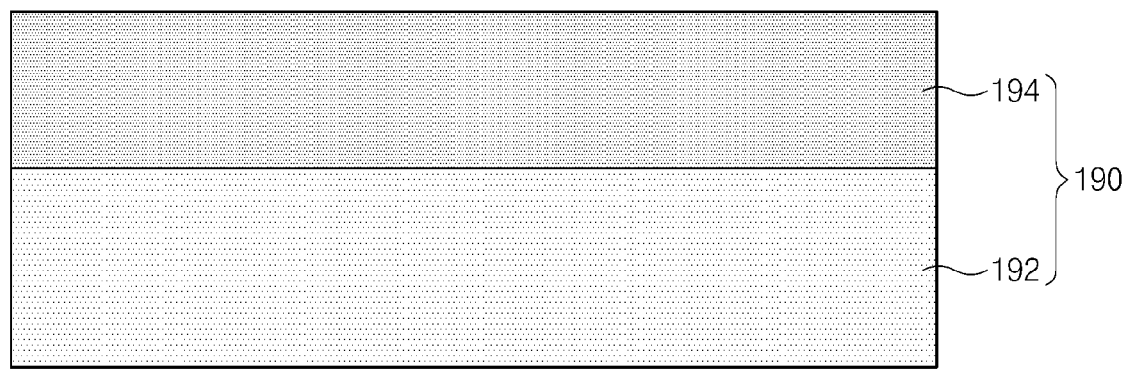

Referring to FIGS. 4 and 6, a resist plate 190 is prepared in operation S120. The preparing of the resist plate 190 may include preparing a plate 192 having the front surface where a resist 194 is formed. The resist 194 may include a material used to form the gate insulation pattern 142 of FIGS. 1 through 3. As one example, the resist 194 may include a photo-setting photo initiator and a monomer. For example, the resist 194 may include an organic matter (such as PVP, PMMA, and HSQ), or an oxide (such as aluminum oxide layer). Additionally, the resist 194 may include an inorganic matter (for example, a silicon oxide layer, a silicon nitride layer, and an aluminum nitride layer) and another organic matter (for example, polyimide and acrylic material).

Figure 7:
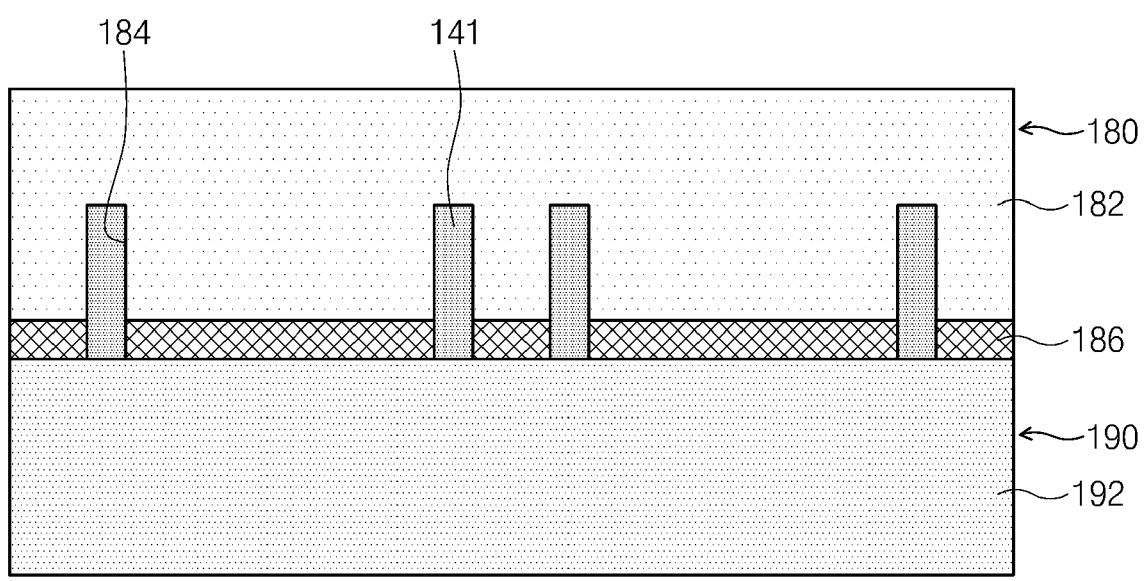

Referring to FIGS. 4 and 7, a resist result 141 is formed in operation S130. The forming of the resist result 141 may include performing an imprint process. The imprint process uses a mold and stamps a thin layer (which is formed in the mold) on a substrate. That is, the imprint process may form a thin layer on the substrate. As one example, the forming of the resist result 141 includes pressing the mold 180 on the resist plate 190. During the pressing of the mode 180 on the resist plate 190, the resist 194 on the plate 192 is filled into the groove 184 of the light transmission plate 182. Accordingly, the resist result 141 having the form of the gate insulation pattern 142 of FIGS. 1 through 3 may be formed in the mold 180.

During the performing of the imprint process, thermally treating of the mold 180 and the resist plate 190 may be added. The thermal treatment may be for effectively filling the groove 184 with the resist 194.

Figure 8:
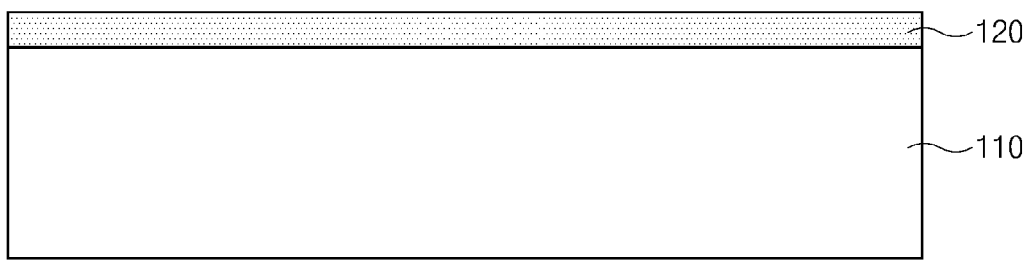

Referring to FIGS. 4 and 8, a substrate 110 is prepared in operation S140. For one example, the preparing of the substrate 110 includes preparing a transparent substrate. For example, the preparing of the substrate 110 may include preparing a glass substrate for manufacturing a display device. The preparing of the substrate 110 further includes forming a buffer layer 120 on the substrate 110. The forming of the buffer layer 120 may include forming an oxide layer on the substrate 110.

Figure 9:
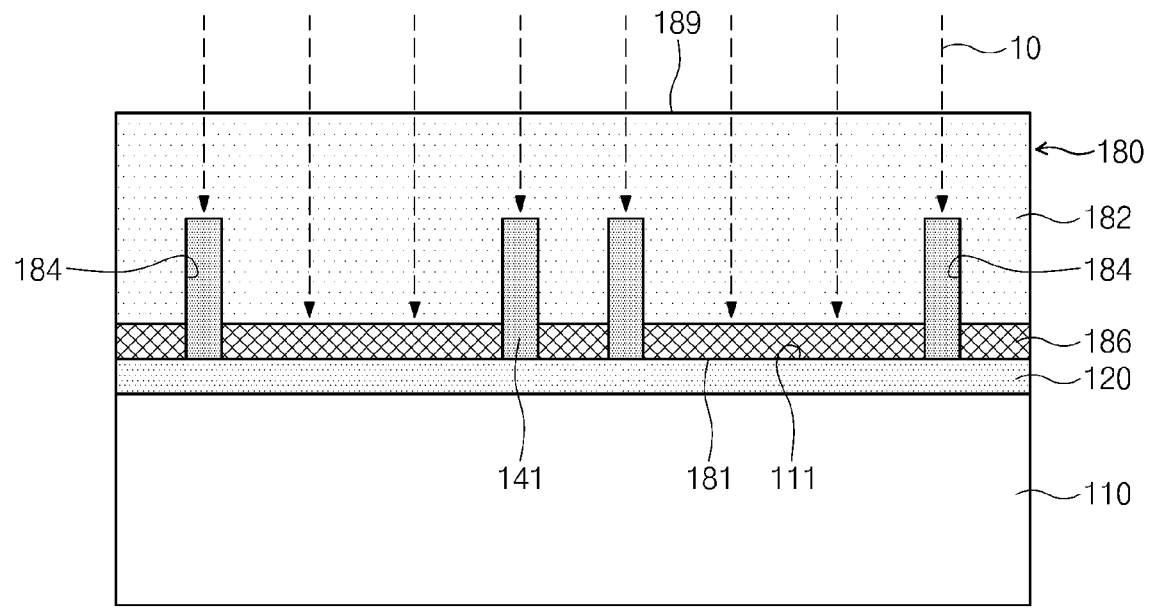

Referring to FIGS. 4 and 9, the resist result 141 may be positioned on the substrate 110. As one example, the mold 180 and the substrate 110 may be aligned to allow the front surface 181 of the mold 180 and the front surface 111 of the substrate 110 to face each other. Additionally, the mold 180 closely contacts the substrate 110. Accordingly, the resist result 141 may be disposed on the buffer layer 120 of the substrate 110.

The resist result 141 is hardened in operation S160. The hardening of the resist result 141 includes performing one of a light process or a heat process on the resist result 141. The performing of the light process includes projecting light 10 toward the mold 180 when the mold 180 and the substrate 110 contact closely. Here, if the mold 180 and the substrate 110 contact closely, the light blocking layer 186 on the light transmission plate 182 may cover a region besides a region of the substrate 110 where the resist result 141 is disposed. On the contrary, the resist result 141 may be selectively exposed to the light transmission plate 182. The light 10 may be projected from the rear surface 189 of the mold 180 toward its front surface 181. Accordingly, the light 10 projected toward the mold 180 passes through the light transmission plate 182, and then selectively hardens the exposed resist result 141. Additionally, the light 10 may be prevented from being projected on the substrate 110 by the light blocking layer 184. Accordingly, the active region pattern 122 and the first insulation layer 124 are not processed by the light 10 and thus may not be hardened. During the closely contacting of the mold 180 and the substrate 110, the resist remaining (not shown) on the front surface 181 of the mold 180 may remain on the substrate 110. The resist remaining is not projected by the light due to the light blocking layer 184, and thus may not be hardened.

Figure 10A:
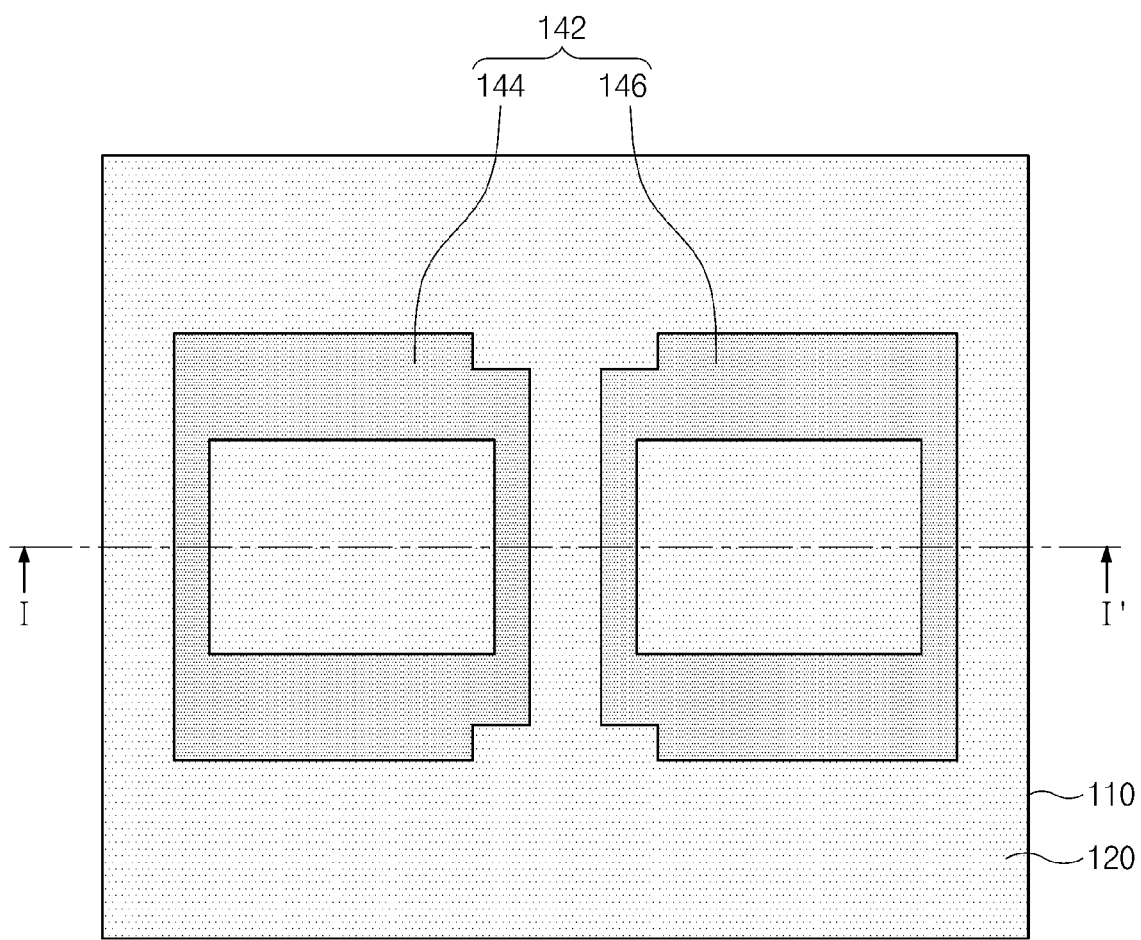
Figure 10B:
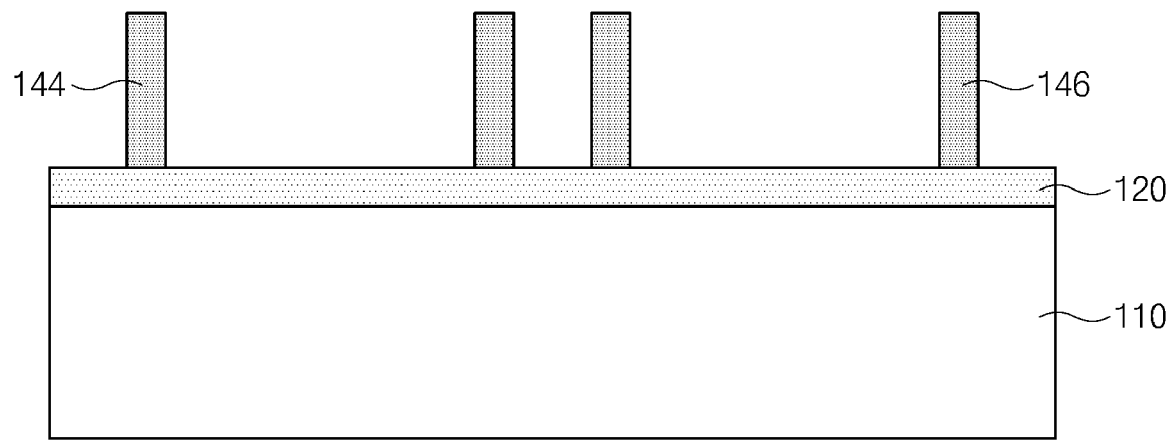

Referring to FIGS. 4, 10A, and 10B, a gate insulation pattern 142 is formed in operation S170. As one example, the mold 180 of FIG. 9 may be separated from the substrate 110 with leaving the resist result 141 on the substrate 110. Accordingly, the sequentially-stacked buffer layer 120 and the first and second gate insulation patterns 144 and 146 may be disposed on the substrate 110.

The resist remaining (not shown) is removed in operation S180. As described above, the resist remaining may remain on the substrate 110. The resist remaining may serve as a factor for increasing a contact resistance of the source/drain 154 of FIGS. 12A and 12B that are to be formed during the following process. Accordingly, a process for removing the resist remaining may be performed. As one example, the removing of the resist remaining may include performing a liquid process on the substrate 110. For example, the liquid process can be performed through a wet cleansing process that supplies various kinds of chemicals to the substrate 110. At this point, the chemicals may use liquid that has a faster etch rate with respect to the resist remaining compared to the gate insulation pattern 142. As mentioned above, during the performing of the light process on the gate insulation patterns 142, the resist remaining (not shown) on the substrate 110 is not projected by the light 10 due to the light blocking layer 186, and thus may not be hardened. Accordingly, during the performing of the liquid process on the substrate 110, the chemicals selectively etch the resist remaining and may not etch the first and second gate insulation patterns 144 and 146.

Figure 11A:
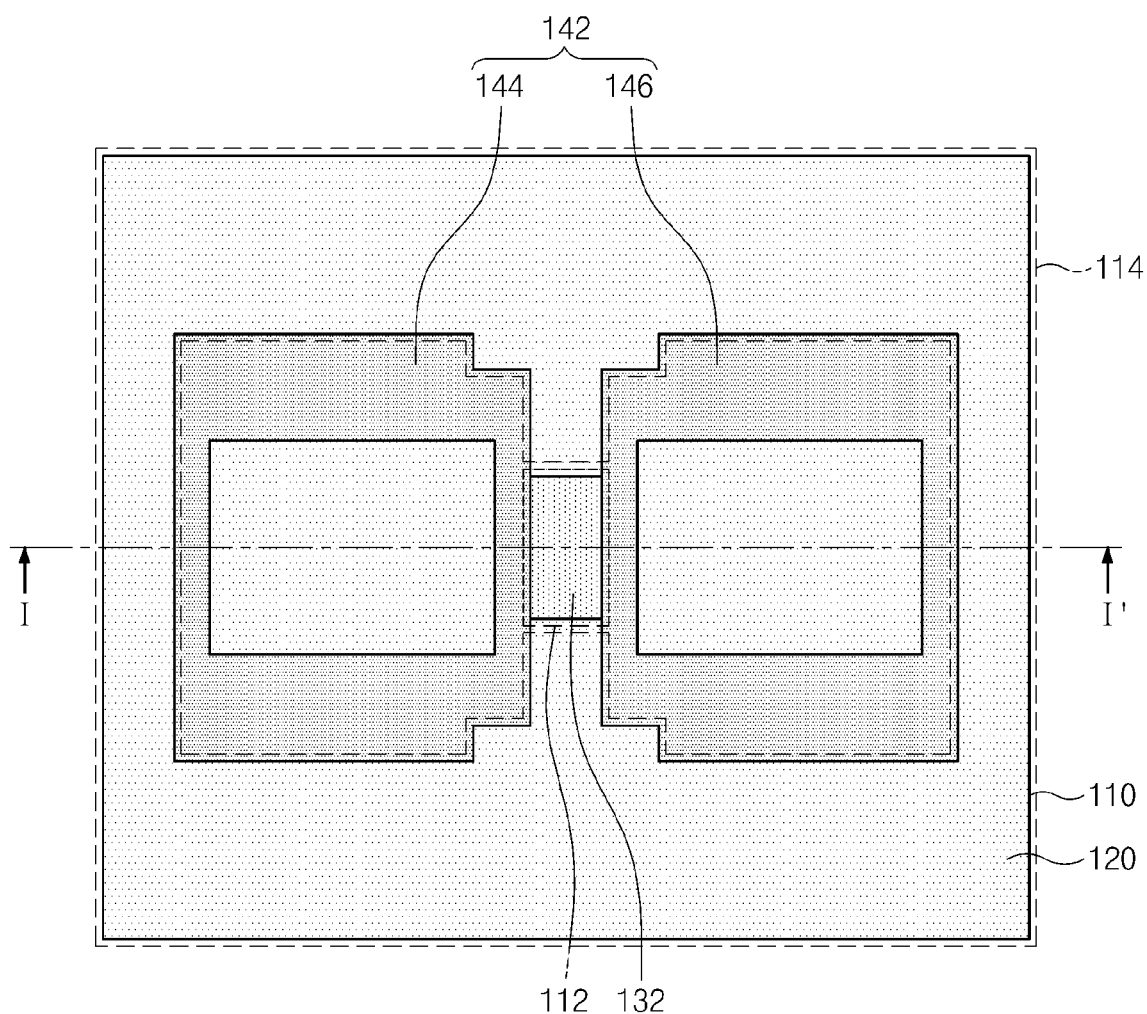
Figure 11B:
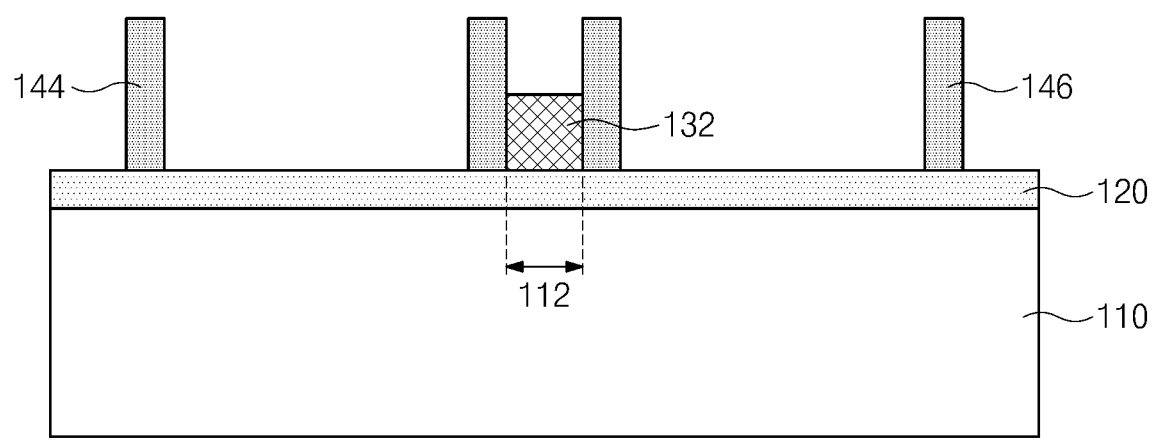

Referring to FIGS. 4, 11A, and 11B, an active region pattern 132 is formed. As one example, the forming of the active region pattern 132 includes forming a channel formation layer to cover the front surface of the substrate 110 and removing the channel formation layer on a region (hereinafter, a second region 114) besides a second region 112. The channel formation layer may include polysilicon. The first region 112 may be a region of the substrate 110 where the active region pattern 132 is formed. The removing of the channel formation layer on the second region 114 includes forming a photoresist pattern to expose the second region 114 and patterning the channel formation layer by using the photoresist pattern as an etching mask. As another example, the forming of the active region pattern 132 includes forming an insulation layer (not shown) on the substrate 110 to expose the first region 112, filling the channel formation material in the first region 112, and removing the insulation layer. The channel formation material may be one of liquid organic semiconductor and polysilicon. The insulation layer may be removed after the forming of the active region pattern 132. The removing of the insulation layer is completed by performing an etch process having an etch selectivity with respect to the first and second gate insulation pattern 144 and 146. As another example, the forming of the active region pattern 132 may include supplying a channel formation material on the second region 114 of the substrate 110 to allow the channel formation material to flow from the second region 114 to the first region 112. Next, the active region pattern 132 may be formed on the substrate 110 by selectively removing the channel formation material on the second region 114. The channel formation material may include a liquid conductive material. For example, the conductive material may include one of a liquid organic semiconductor and polysilicon.

Figure 12A:
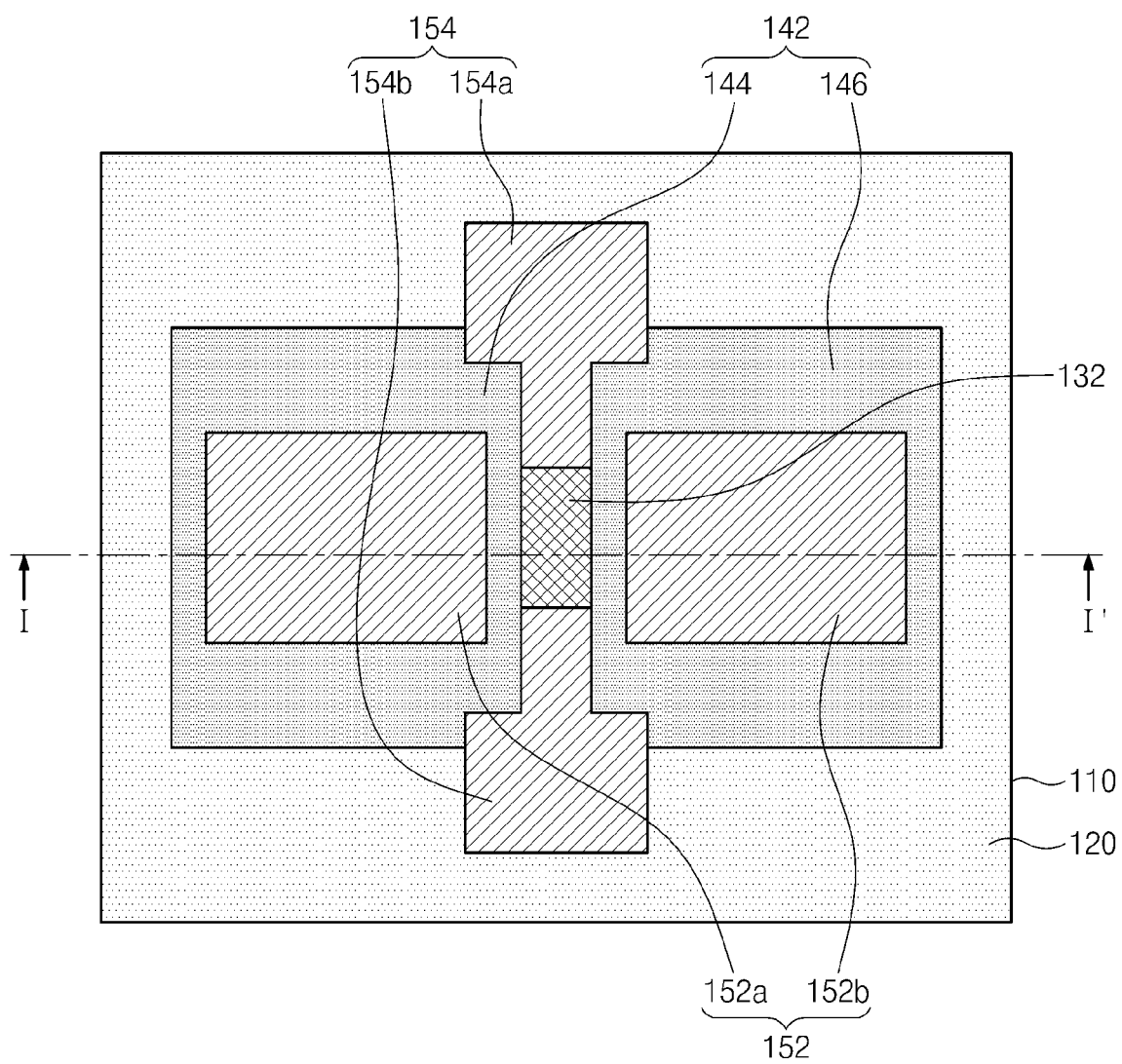
Figure 12B:
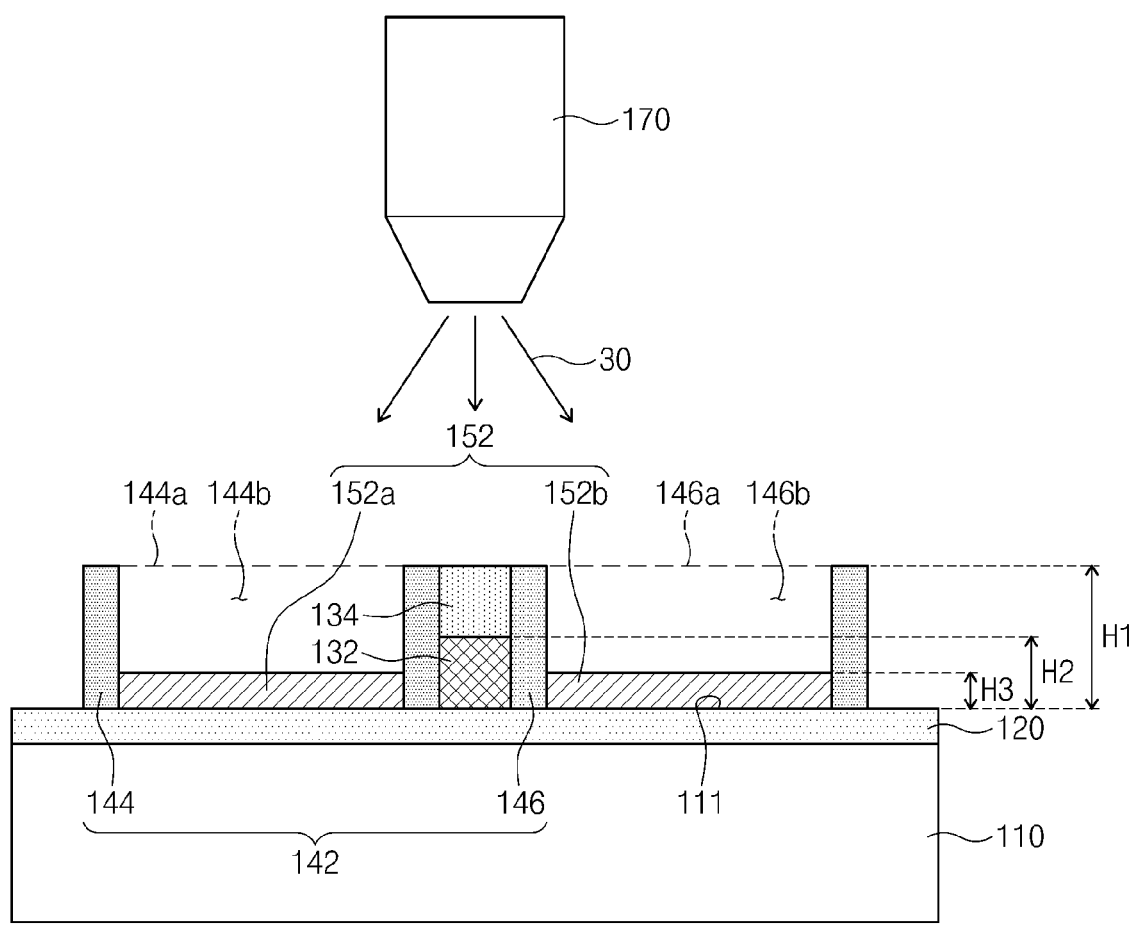

Referring to FIGS. 4, 12A, and 12B, a gate electrode 152 and a source/drain 154 are formed in operation S180. For example, the forming of the gate electrode 152 and the source/drain 154 includes supplying a conductive material 30 on the gate electrode 152. The conductive material 30 may include a metal material. For example, the conductive material 30 includes at least one of Al, Cu, Mo, W, Cr, Ag, Au, and Pt. Additionally, the conductive material 30 may include one organic conductor of PANI, a conducting polymer (for example, PEDOT), CNT, Pyrrolidine, and Graphite. Or, the conductive material may include an organic matter and a semiconductive polymer material.

Before the supplying of the conductive material 30, a passivation layer 134 may be formed to cover the active region pattern 132. The passivation layer 134 is used to prevent the conductive material 30 from covering the top surface of the active region pattern 132. The forming of the passivation layer 134 may include forming an insulation layer to cover the top surface of the active region pattern 132.

The supplying of the conductive material 30 may be completed using a distributor 170. As one example, the distributor 170 supplies the liquid conductive material 30 of a predetermined amount on the substrate 110 several times. As another example, the distributor 170 may include a spray that injects the conductive material 30 on the front surface 111 of the substrate 110. A portion of the conductive material 30, which is supplied to the substrate 110 by the distributor 170, is supplied to the first inner space 144b through the open top 144a of the first gate insulation pattern 144. The conductive material 30 flowing into the first inner space 144b is self-aligned by the first gate insulation pattern 144 and thus becomes the first gate electrode 152a. Another portion of the conductive material 30 may be supplied into the second inner space 146b through the open top 146a of the second gate insulation pattern 146. The conductive material 30 flowing into the second inner space 146b is self-aligned by the first gate insulation pattern 146 and becomes the second gate electrode 152b. Another portion of the conductive material 30 is supplied to the external of the gate insulation pattern 142 and becomes the source/drain 154. For example, the top height H2 of the active region pattern 132 and the top height H1 of the gate insulation pattern 142 are higher than the top height H3 of the gate electrode 152 and the top height H4 of the source/drain 154. Accordingly, the conductive material 30 supplied to the external of the gate insulation pattern 142 is self-aligned by the active region pattern 132 and the gate insulation pattern 142, and then is applied on the substrate to form a source/drain layer. Additionally, by patterning a portion of the source/drain layer, the source/drain electrodes 154a and 154b are formed on the substrate 110. Accordingly, the source/drain electrodes 154a and 154b adjacent to the active region pattern 132 are self-aligned by the active region pattern 132 and the gate insulation pattern 142.

Moreover, the supply amount of the conductive material 30 is controlled to prevent the conductive material 30 from overflowing from the first and second inner spaces 144b and 146b of the gate insulation pattern 142. This is for electrically disconnecting the gate electrode 152 from the source/drain 154. Additionally, the supply amount of the conductive material 30 is controlled to allow the top height H3 of the source and drain electrodes 154 and 154b to be lower than the top height H1 of the gate insulation pattern 142 and the top height H2 of the active region pattern 132. This is for the source/drain 154 to be self-aligned by the gate insulation pattern 142 and the active region pattern 132.

As mentioned above, the self aligned field effect transistor structure 100 according to an embodiment of the present invention may include the first and second gate electrodes 152a and 152b which are symmetric with respect to the active region pattern 132. The self aligned field effect transistor structure 100 controls a channel formation of the active region pattern 132 using the gate electrodes 152a and 152b in order to accurately and stably operate as a switching device.

The self aligned field effect transistor structure 100 includes the gate electrode 152 and the source/drain 154, which are disposed on the same plane of the substrate 110. Accordingly, the self aligned field effect transistor structure 100 prevents a parasitic capacitance between the substrate 110 and the gate electrode 152 and between the substrate 110 and the source/drain 154. Therefore, an operation speed of a transistor can be improved.

The gate electrode 152 and the source/drain 154 are self-aligned by the gate insulation pattern 142. According to the present invention, the gate electrode 152 and the source/drain 154 are simultaneously formed through an imprint method. Therefore, the formation processes of the self aligned field effect transistor structure 100 can be simplified.

Additionally, the self aligned field effect transistor structure 100 according to an embodiment of the present invention does not include resist remaining between the substrate 110 and the source/drain 154. Accordingly, the self aligned field effect transistor structure 100 according to the present invention reduces a leakage current through a double gate structure between the substrate 110 and the source/drain 154 and also improves driving characteristics. Thus, an operation speed of the self aligned field effect transistor structure 100 can be faster.

The self aligned field effect transistor structure according to the present invention includes gate electrodes at both sides of an active region pattern. Accordingly, the self aligned field effect transistor structure reduces a leakage current and improves driving characteristics such that its operation speed can be faster.

The self aligned field effect transistor structure according to the present invention includes an active region pattern, a gate electrode, and a source/drain on the same plane, such that double gate electrodes between the substrate and the gate electrode and between the substrate and the source/drain can be provided to prevent a parasitic capacitance.

A self aligned field effect transistor structure according to the present invention reduces a contact resistance between a substrate and a source/drain, such that its operation speed can be faster.

A self aligned field effect transistor structure according to the present invention includes a gate conductive layer and a source/drain, which are formed simultaneously using an imprint method. Accordingly, the present invention can simplifies manufacturing processes of the self aligned field effect transistor structure.

A self aligned field effect transistor structure according to the present invention includes a self-aligned gate conductive layer and source/drain.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A self aligned field effect transistor structure comprising:
   an active region pattern on a substrate;
   a first gate electrode and a second gate electrode facing each other with the active region pattern therebetween; and
   a source electrode and a drain electrode connected to the active region pattern and disposed to be symmetric with respect to a line connecting the first and second gate electrodes,
   wherein the first and second gate electrodes and the source and drain electrodes are disposed on the same plane of the substrate, and
   a top height of the active region pattern is higher than top heights of the source and drain electrodes.

2. The self aligned field effect transistor structure of claim 1, wherein the active region pattern is disposed on the same plane of the substrate.

3. The self aligned field effect transistor structure of claim 1, further comprising:
   a first gate insulation pattern surrounding the first gate electrode; and
   a second gate insulation pattern surrounding the second gate electrode.

4. The self aligned field effect transistor structure of claim 3, wherein the first and second gate insulation patterns and the source and drain electrodes are disposed to surround side surfaces of the active region pattern, without covering a top surface of the active region pattern.

5. The self aligned field effect transistor structure of claim 3, wherein the top heights of the first and second gate insulation patterns are higher than the top heights of the first and second gate electrodes and the top heights of the source and drain electrodes.

6. A self aligned field effect transistor structure comprising:
   an active region pattern on a substrate;
   a first gate electrode and a second gate electrode facing each other with the active region pattern therebetween;
   a source electrode and a drain electrode connected to the active region pattern and disposed to be symmetric with respect to a line connecting the first and second gate electrodes,
   a first gate insulation pattern surrounding the first gate electrode; and
   a second gate insulation pattern surrounding the second gate electrode,
   wherein the first and second gate electrodes and the source and drain electrodes are disposed on the same plane of the substrate, and
   wherein the top height of the active region pattern is lower than the top heights of the first and second gate insulation patterns and is higher than the top heights of the source and drain electrodes.

7. The self aligned field effect transistor structure of claim 3, wherein the first and second gate electrodes are self-aligned by the first and second gate insulation patterns.

8. The self aligned field effect transistor structure of claim 3, wherein the source and drain electrodes are self-aligned by the active region pattern and the first and second gate insulation patterns.

9. The self aligned field effect transistor structure of claim 1, wherein the first and second gate electrodes and the source and drain electrodes comprise the same conductive material.

10. The self aligned field effect transistor structure of claim 9, wherein the first and second gate electrodes and the source and drain electrodes comprise at least one of Al, Cu, Mo, W, Cr, Ag, Au, Pt, Polyaniline (PANI), a conductive polymer such as PEDOT, a Carbon Nano Tube (CNT), Pyrrolidine, graphite, an organic matter, and a semiconductive polymer.

11. A self aligned field effect transistor structure comprising:
    an active region pattern on a substrate;
    a first gate electrode and a second gate electrode facing each other with the active region pattern being disposed therebetween; and
    a source electrode and a drain electrode connected to the active region pattern;
    wherein the first and second gate electrodes and the source and drain electrodes are disposed on the same plane of the substrate, and a top height of the active region pattern is higher than top heights of the source and drain electrodes.

12. The self aligned field effect transistor structure of claim 11, further comprising:
    a first gate insulation pattern surrounding all side surfaces of the first gate electrode, without covering a top surface of the first gate electrode; and
    a second gate insulation pattern surrounding all side surfaces of the second gate electrode, without covering a top surface of the second gate electrode.

13. The self aligned field effect transistor structure of claim 12, wherein the top height of the active region pattern is lower than top heights of the first and second gate insulation patterns.

* * * * *